US011274988B2

(12) United States Patent
Xuan

(10) Patent No.: US 11,274,988 B2
(45) Date of Patent: Mar. 15, 2022

(54) DUAL-CRITERION DIAGRAM METHODS FOR DESIGNING AND ASSESSING THE LIFE AND STRENGTH OF HIGH-TEMPERATURE ROTATING COMPONENTS

(71) Applicant: East China University of Science and Technology, Shanghai (CN)

(72) Inventor: Fuzhen Xuan, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 563 days.

(21) Appl. No.: 16/236,399

(22) Filed: Dec. 29, 2018

(65) Prior Publication Data

US 2019/0170607 A1    Jun. 6, 2019

Related U.S. Application Data

(63) Continuation-in-part of application No. PCT/CN2017/094593, filed on Jul. 27, 2017.

(30) Foreign Application Priority Data

Mar. 21, 2017   (CN) .......................... 201710169339.8

(51) Int. Cl.
*G01M 99/00*    (2011.01)
*G01M 15/14*   (2006.01)
(Continued)

(52) U.S. Cl.
CPC .......... *G01M 5/0041* (2013.01); *G01M 15/00* (2013.01); *G01N 25/00* (2013.01);
(Continued)

(58) Field of Classification Search
CPC .. G01N 3/18; G01N 3/00; G01N 3/32; G01M 99/00; G01M 13/00; G01M 15/00; G01M 15/14; G06F 17/50; G06F 19/00
See application file for complete search history.

(56) References Cited

U.S. PATENT DOCUMENTS 9,483,605 B2 * 11/2016 Morris ................... G06F 30/17
2009/0316748 A1 * 12/2009 Wawrzonek ............. G01N 3/18
374/46

FOREIGN PATENT DOCUMENTS

CN    105158084    12/2015
CN    106153311    11/2016
(Continued)

OTHER PUBLICATIONS

Zhang, et al., "Creep Damage Evaluation of Steam Turbine Rotor Steel by Using the Nonlinear Ulliasonic Technique," Chinese Journal of Mechanical Engineering, Jan. 31, 2016, vol. 52, No. 2, pp. 76-80.
(Continued)

*Primary Examiner* — Brandi N Hopkins
(74) *Attorney, Agent, or Firm* — Hovey Williams LLP

(57) ABSTRACT

The disclosure relates to a dual-criterion diagram for designing and assessing the life and strength of high-temperature rotating components and its establishment. In addition, the disclosure relates to a method for designing and assessing the life and strength of high-temperature rotating components based on the dual-criterion diagram for designing and assessing the life and strength of high-temperature rotating components. The advantages of the disclosure include a simple design and assessment process, high operability, and reliable assessment results. The invention is expected to be applied finally to assessment and evaluation of high-cycle fatigue life of rotating components at high temperatures.

9 Claims, 9 Drawing Sheets

(51) Int. Cl.
*G01M 5/00* (2006.01)
*G06F 30/17* (2020.01)
*G06F 11/00* (2006.01)
*G01N 25/00* (2006.01)
*G01M 15/00* (2006.01)

(52) U.S. Cl.
CPC ............ *G06F 11/008* (2013.01); *G06F 30/17* (2020.01); *G01N 2203/0071* (2013.01); *G01N 2203/0073* (2013.01); *G01N 2203/0226* (2013.01)

(56) References Cited

FOREIGN PATENT DOCUMENTS

| | | |
|---|---|---|
| CN | 106202630 | 12/2016 |
| CN | 106908206 | 6/2017 |
| JP | 2005-227065 | 8/2005 |

OTHER PUBLICATIONS

Machine Translation of CN106908206, 12 pages.
Machine Translation of CN106202630, 14 pages.
Machine Translation of CN106153311, 15 pages.
Machine Translation of CN105158084, 16 pages.
Machine Translation of JP2005-227065, 18 pages.
International Search Report dated Dec. 27, 2017 in corresponding PCT/CN2017/094593.

* cited by examiner

DUAL-CRITERION DIAGRAM METHODS FOR DESIGNING AND ASSESSING THE LIFE AND STRENGTH OF HIGH-TEMPERATURE ROTATING COMPONENTS

TECHNICAL FIELD

The disclosure pertains to the field of strength design for mechanical structures, and particularly to a dual-criterion diagram method for designing and assessing the life and strength of high-temperature rotating components. In particular, the disclosure relates to a dual-criterion diagram method for designing and assessing the life and strength of mechanical structures at high temperatures and alternating service loads. The dual-criterion diagram method is particularly suitable for strength design and safety analysis of components experiencing high temperatures and alternating mechanical loads in equipment such as aeroengines, gas turbines, compressors, etc.

BACKGROUND

In compliance with the principles of energy saving, consumption reduction, high efficiency and environmental protection, higher temperature, higher pressure and longer service represent a new trend of equipment in electric power, refining and chemicals, metallurgy, aviation industries. For example, a single ultra-supercritical generator unit in a power plant has a power of 1000 MW or more, operating at 600-650° C./32-35 MPa, and a designed life up to 30 years. The turbine of an advanced aeroengine has a front inlet temperature of 1980-2080° C., a thrust to weight ratio of 15-20 or more, and a maximum service life of more than 40,000 hours. Nowadays, the development of 700° C. thermal power and 4th generation nuclear power technologies is also aiming for high temperature and pressure parameters and a long designed life. Due to a high rotating speed of a high-temperature rotating components, the mean stress caused by the centrifugal force is high. Moreover, the dead-weight of the component generates alternating stress in the course of rotation. The alternating stress is smaller than the mean stress. Hence, high-cycle fatigue with high mean stress at high temperature poses a challenge to the rotating structures. In addition, the equipment also faces a creep problem at such high temperatures.

The existing method for high-cycle fatigue design of high-temperature rotating components is mainly based on the Goodman Theory, including acquiring working conditions and material parameters to conduct stress analysis for high-temperature rotating components, calculating high-cycle fatigue damage and life by Goodman Equation, and finally assessing the high-cycle fatigue strength. However, the cutoff point of a Goodman curve on the abscissa corresponds to the tensile strength of a material, which makes the applicability of Goodman Theory at high temperatures open to question as the material will creep at high temperatures. Additionally, it is known that the Goodman curve method is conservative to treat the influence of mean stress on fatigue behavior, such that the potential of a material cannot be utilized fully. Thus, it's necessary to develop a new design method that better balances safety and economy.

Chinese Patent Applications Nos. CN201510586289.4 (A Method for Predicting Creep-fatigue Life of Materials), CN201410140477.X (A Method for Evaluating Low-cycle Creep-fatigue Life at High Temperature under Multi-axial Spectrum Loads), CN201310738774.X (A Lifetime-based Method for Designing Creep-fatigue Strength of High Temperature Pressure Vessels), and CN201310272042.6 (A Method for Predicting Creep-fatigue Life of Aluminum Alloy Pistons of High-power Diesels); Japanese Patent Nos. JP2006044364 (Damage Evaluation Method by Metal Texture as to Creep Fatigue Damage), JP05171031 (Method for Estimating Superposed Damage of Creep and Fatigue of High-Temperature Structure Material); European Patent Application Nos. CN20151586289 (filing date: Sep. 15, 2015; Forecasting Method for Creep-Fatigue Life of Material) and CN20141140477 (filing date: Apr. 9, 2014; Low-Cycle Creep and Fatigue Life Evaluation Method under Conditions of High Temperature and Multiaxial Spectrum Load), either placed emphasis on methods for life prediction under creep-fatigue interactions, or focused on methods for evaluating damage of structural materials under creep-fatigue conditions. These methods have complex processes, while do not involve structural strength design and safety evaluation under creep and fatigue loadings. Therefore, there is an urgent need to develop a simple method of life and strength analysis that is readily operable and inclusive of both creep and fatigue failure mechanism.

SUMMARY

With respect to the high-temperature and high-cycle fatigue problem of high-temperature rotating components, the disclosure provides the establishment method of a dual-criterion diagram for designing and assessing the life and strength of high-temperature rotating components, and the application of the dual-criterion diagram method into designing and assessing the life and strength of high-temperature rotating components diagram, so as to solve the problems in current existing techniques.

To achieve the above object, the disclosure adopts the following technical solution.

In the first aspect, the disclosure provides a method for establishing a dual-criterion diagram for designing and assessing the life and strength of high-temperature rotating components, which is comprised of the following steps: $S_1$, conducting high temperature fatigue and creep tests using the material in high-temperature rotating components, respectively, with an exemplary high-temperature fatigue test being conducted using an electromagnetic resonance high-frequency testing machine including a heating device and operated in a stress control mode (e.g., a commercial PLG™ 100C-type machine—offered by Jinan Precision Testing Equipment Co., Ltd.—operating within a frequency range of fifty to two hundred and fifty Hertz (50-250 Hz)(inclusive) for elevated temperature testing in accordance with, for example, ASTM® E466) and an exemplary high-temperature creep test being conducted using a lever-type mechanical creep testing machine including a heating device and operated in a stress control mode (e.g., a commercial RDJ™ 50-type machine—offered by Changchun Research Institute for Mechanical Science Company—for elevated temperature testing in accordance with, for example, ASTM® E139), each of the aforementioned ASTM® techniques being propagated by the American Society for Testing and Materials Corporation as of the filing date of the present disclosure; $S_2$, obtaining fatigue strengths of the material for, a given life from the high-temperature fatigue test at stress ratios of R=−1 and R=0, wherein data scattering should be taken into account by giving a safety factor when fatigue test data are converted into design data; $S_3$, obtaining creep rupture strength data from the high-temperature creep tests; $S_4$, plotting the fatigue portion of the dual-criterion diagram for designing and assessing the life and strength of the high-temperature rotating components from the fatigue data of the high-temperature rotating components material obtained in step $S_2$, so as to obtain a straight line with an abscissa axis representing the mean stress and an ordinate axis representing the stress amplitude, as shown in FIGS. 4(a) and 4(b); $S_5$, plotting the creep portion of the dual-criterion diagram for designing and assessing the life and strength of the high-temperature rotating components from the creep rupture strength data of the high-temperature rotating member material obtained in step $S_3$, as shown in FIGS. 4(a) and 4(b), where the creep portion is a cutoff line of the straight line in step $S_4$, and a straight line perpendicular to the abscissa axis representing the mean stress. FIG. 4(a) shows a dual-criterion diagram for the same life (N, t) at different temperatures (T); and FIG. 4(b) shows a dual-criterion diagram at the same temperature (T) for different lives (N, t).

In one embodiment, in step $S_2$, in the case that an S-N curve of the material is known, the fatigue strength of the material for a given life can be obtained by interpolating or extrapolating the S-N curve.

In one embodiment, step $S_4$ is comprised of plotting the fatigue data results based on the fatigue data corresponding to the designed life at stress ratios of R=−1 and R=0 obtained in step $S_2$, with the abscissa axis representing the mean stress and the ordinate axis representing the stress amplitude, wherein the fatigue portion in step $S_4$ may be represented by the following Equation (1):

$$\sigma_a = \frac{\sigma_0 - \sigma_{-1}}{\sigma_0}\sigma_m + \sigma_{-1} \quad (1)$$

where $\sigma_m$ is the mean stress; $\sigma_a$ is the stress amplitude; $\sigma_{-1}$ represents a fatigue strength for a designed life at R=−1; and $\sigma_0$ represents a fatigue strength for the designed life at R=0.

In one embodiment, the creep portion in step $S_5$ may be represented by the following Equation (2):

$$\sigma_m = \sigma(t, T) \quad (2)$$

where $\sigma_m$ is the mean stress; $\sigma(t,T)$ is a creep rupture strength at a service temperature for a designed life; t represents the service time; T represents the service temperature; wherein Equation (2) indicates that the mean stress at this time is equivalent to the creep rupture strength for the designed life.

In the second aspect, the disclosure provides a dual-criterion diagram established according to the method of the first aspect for designing and assessing the life and strength of high-temperature rotating components.

In another aspect, the disclosure provides a method for designing and assessing the life and strength of high-temperature rotating components with the dual-criterion diagram for designing and assessing the life and strength of high-temperature rotating components according to the second aspect, which is comprised of the following steps: $S_6$, conducting stress analysis of the high-temperature rotating component based on material performance parameters and service parameters of the high-temperature rotating components to obtain mean stress and stress amplitude of the high-temperature rotating component at alternating loads, and to determine the critical section and critical point of the high-temperature rotating component under service conditions; and $S_7$, plotting the mean stress and stress amplitude of the high-temperature rotating component at the critical section and critical point into the dual-criterion diagram, wherein the high-temperature rotating component is safe in a designed life if a point having a horizontal coordinate representing the mean stress and a vertical coordinate representing the stress amplitude falls in the safe region.

In one embodiment, in step $S_6$, determining the critical section and critical point of the high-temperature rotating component under service conditions may include determination of the high mean stress region and the high stress amplitude region of the high-temperature rotating component.

In one embodiment, in step $S_6$, the material performance parameters of the rotating component may include linear expansion coefficient α, elastic modulus E, Poisson ratio μ and material density ρ, while the service parameters of the high-temperature rotating component may include rotating speed, thermal boundary and displacement boundary.

In one embodiment, in step $S_6$, the material performance data of the rotating component can be obtained by searching a database of material performances or by conducting corresponding tests.

In one embodiment, in step $S_7$, if a point having a horizontal coordinate representing the mean stress and a vertical coordinate representing the stress amplitude does not fall in the safe region, the design scheme can be modified as a result, and relaunching step $S_6$ for the analysis.

Compared with existing techniques, the advantages of the current disclosure include a simple design and assessment process, high operability, and reliable assessment results. The invention is expected to be applied finally to assessment and evaluation of high-cycle fatigue life of rotating components at high temperatures.

DESCRIPTION OF THE DRAWINGS

FIGS. 4(a)-(b) are schematic diagrams comprising dual-criterion diagrams for designing and assessing the life and strength of high-temperature rotating components according to the disclosure, wherein FIG. 4(a) shows a dual-criterion diagram for the same life (N, t) at different temperatures (T); and FIG. 4(b) shows a dual-criterion diagram at the same temperature (T) for different lives (N, t). In FIGS. 4(a)-(b), T represents the designed temperature; t represents the designed life; and N represents the number of cycles at the corresponding designed life.

FIGS. 5(a)-(d) are diagrams showing the results of the finite element analysis in an embodiment according to the disclosure, wherein FIG. 5(a) shows a temperature field of the rotating axis; FIG. 5(b) shows the mean stress at the location assessed; FIG. 5(c) shows the stress amplitude at the location assessed; and FIG. 5(d) shows specific paths for assessment.

DETAILED DESCRIPTION

Preferred embodiments of the disclosure are provided below with reference to the accompanying drawings to illustrate the technical solution of the disclosure in detail, and examples are provided. However, it should be noted that the implementation of the invention is not limited to the following embodiments.

Example 1

Figure 1:
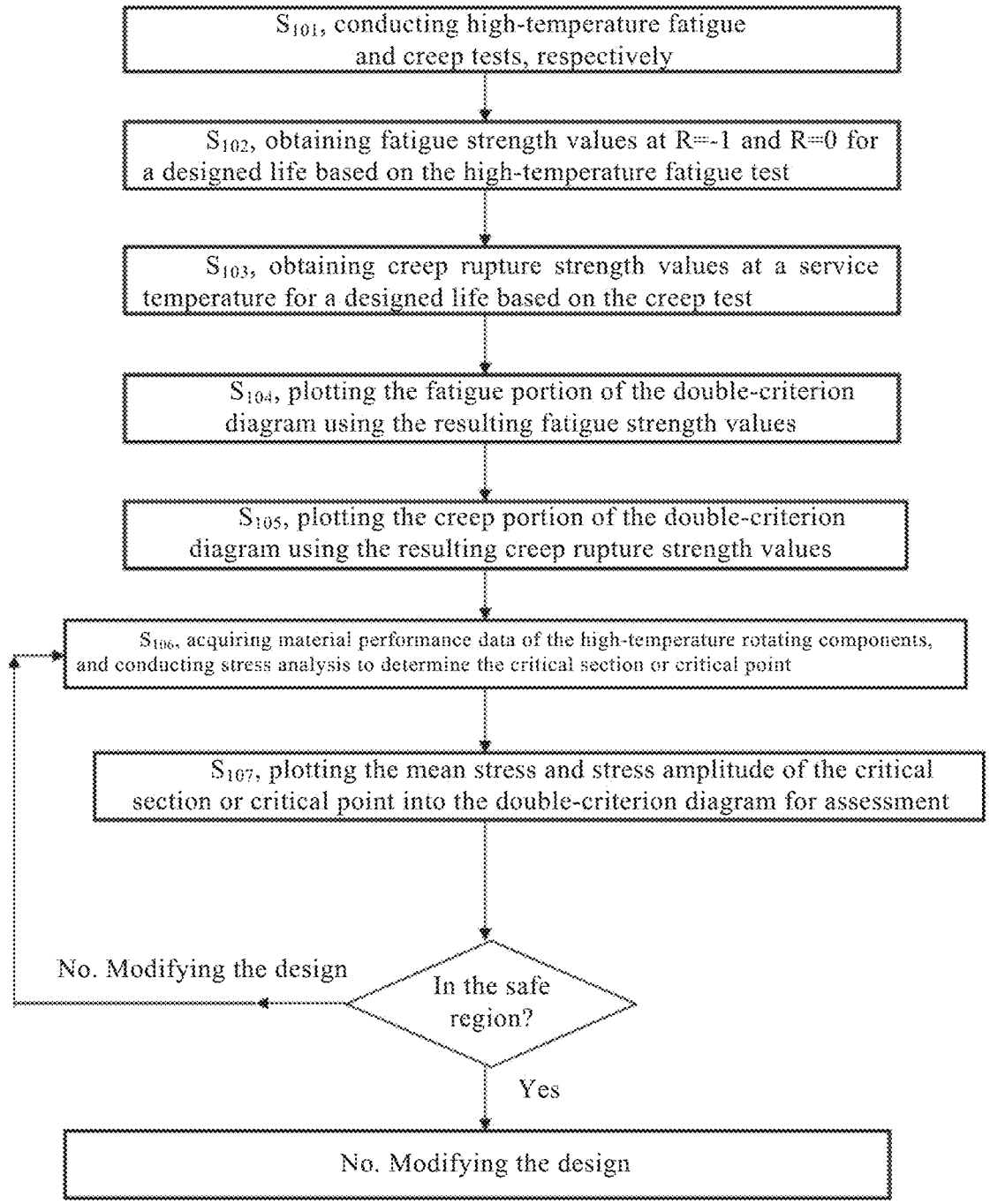
FIG. 1 is a flow chart of a preferred embodiment according to the disclosure.

A rotating axis 10 having a rotating speed of 3000 rpm, a designed life of 30 years, and a material of heat resistant ferrite steel is needed for assessment of high-cycle fatigue strength in a temperature range of 600-613° C. under steady working conditions (see FIG. 1).

Figure 2:
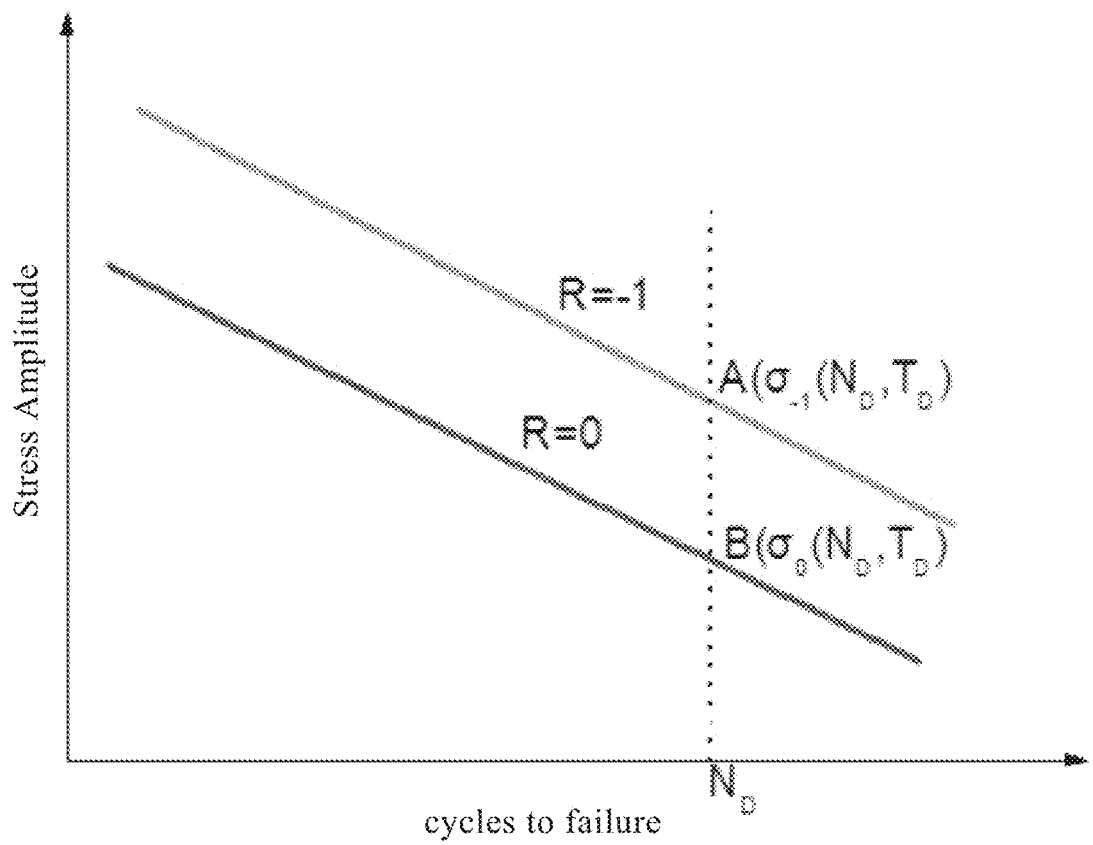
FIG. 2 is a schematic diagram showing S-N curves of a high-temperature rotating component material at a designed temperature according to the disclosure.
Figure 3:
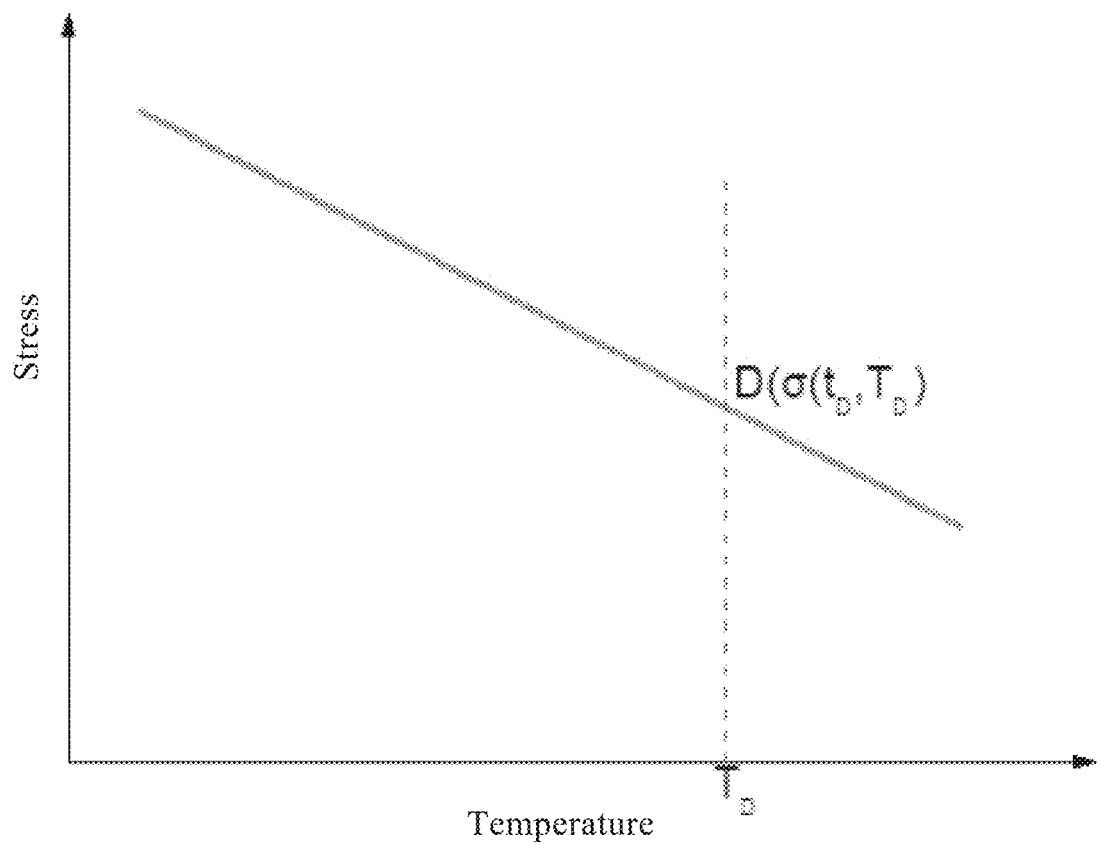
FIG. 3 is a schematic diagram showing creep rupture strengths of a high-temperature rotating component material at different temperatures according to the disclosure.
Figure 4A:
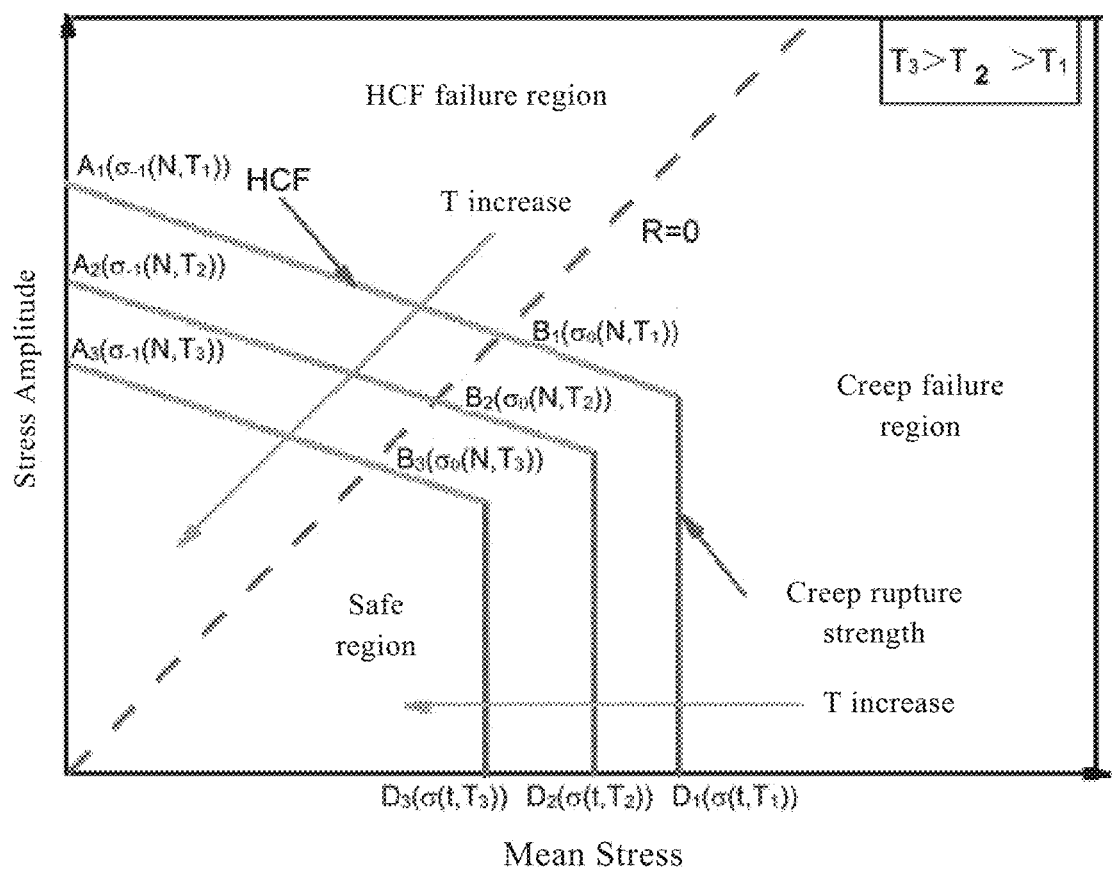
Figure 4B:
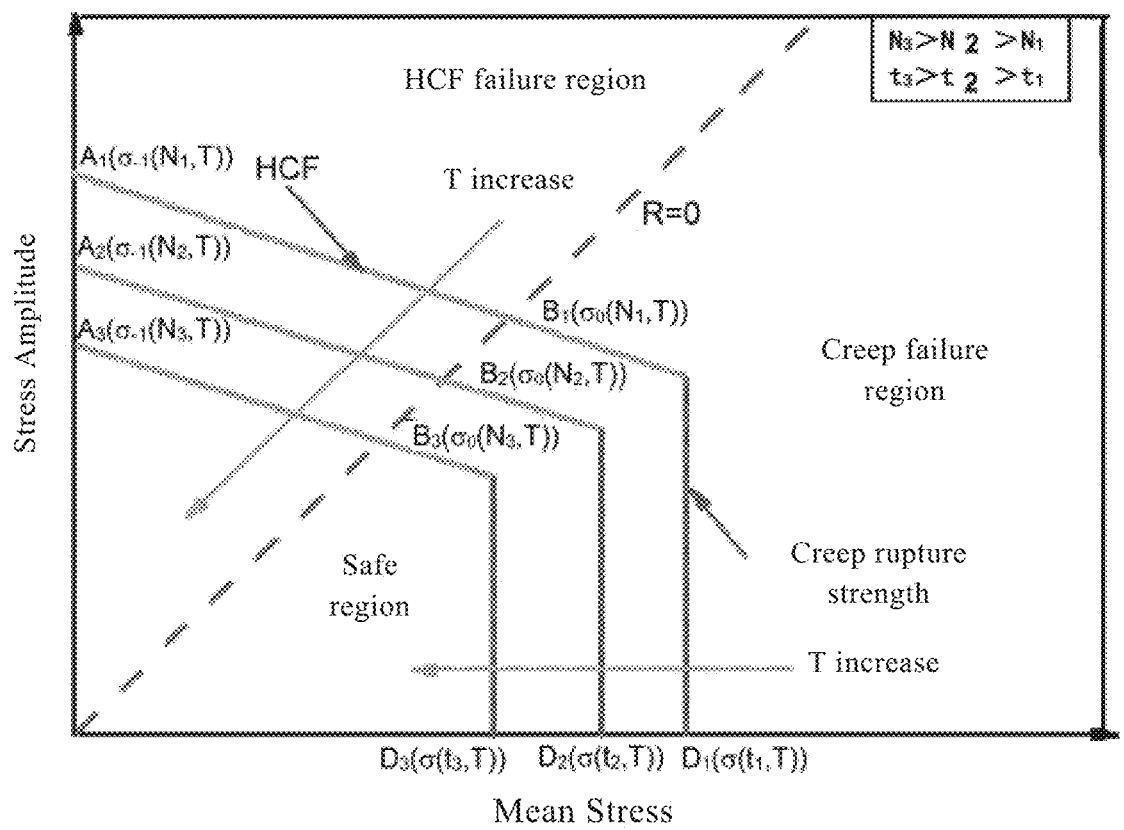
Figure 5A:
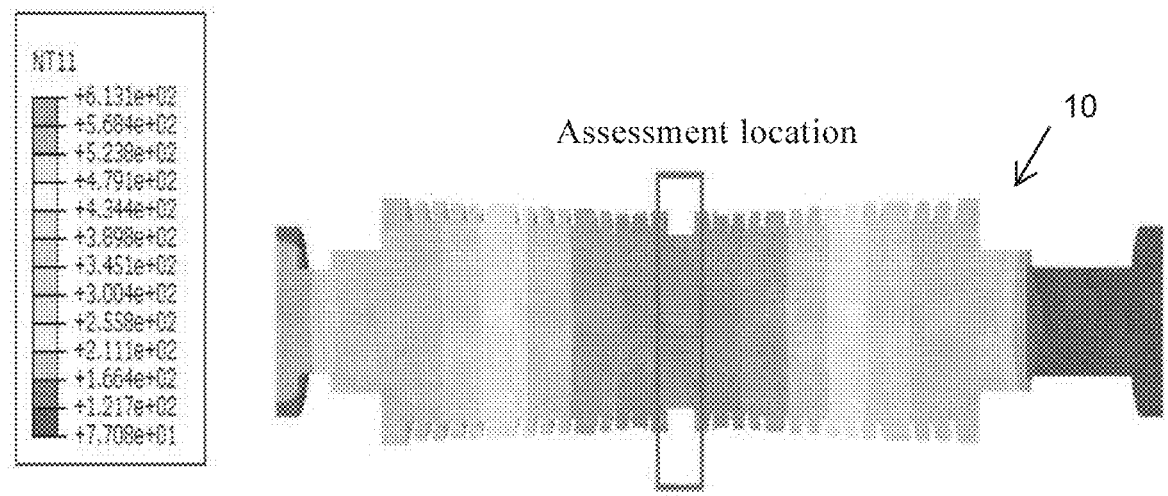
Figure 5B:
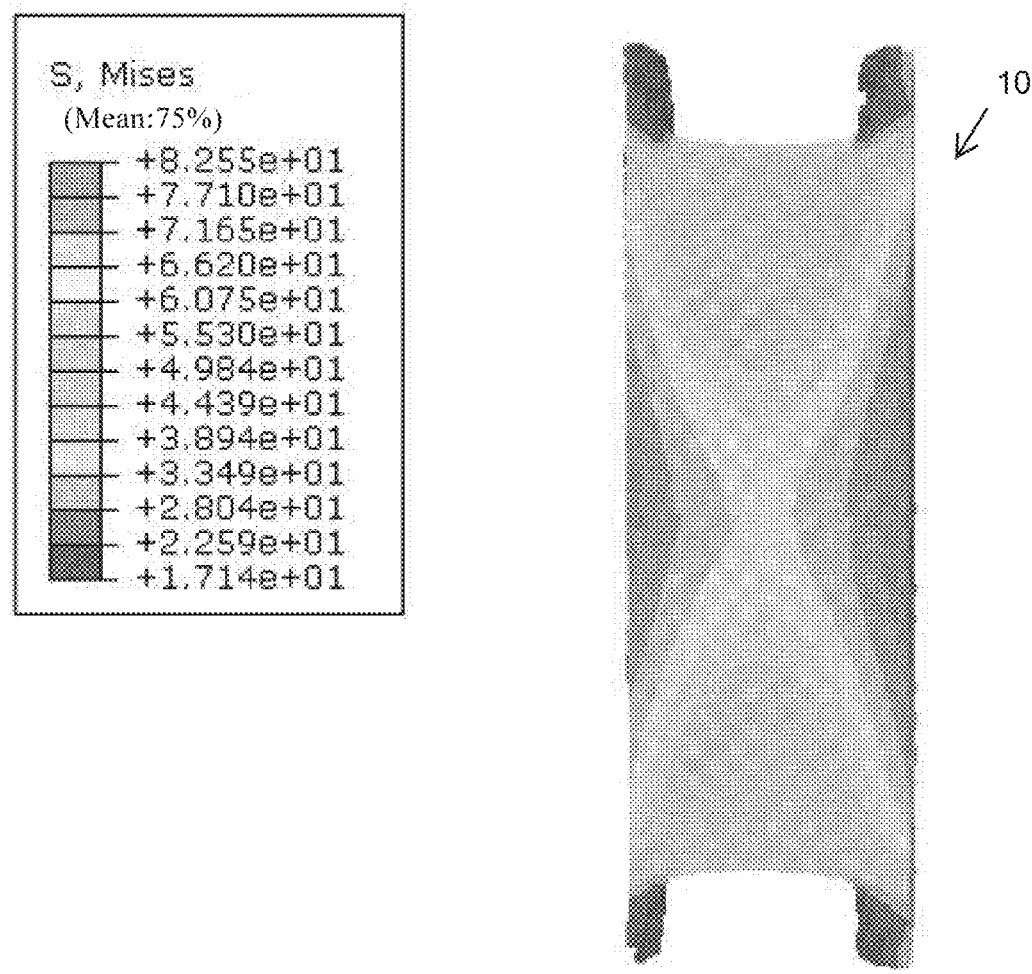
Figure 5C:
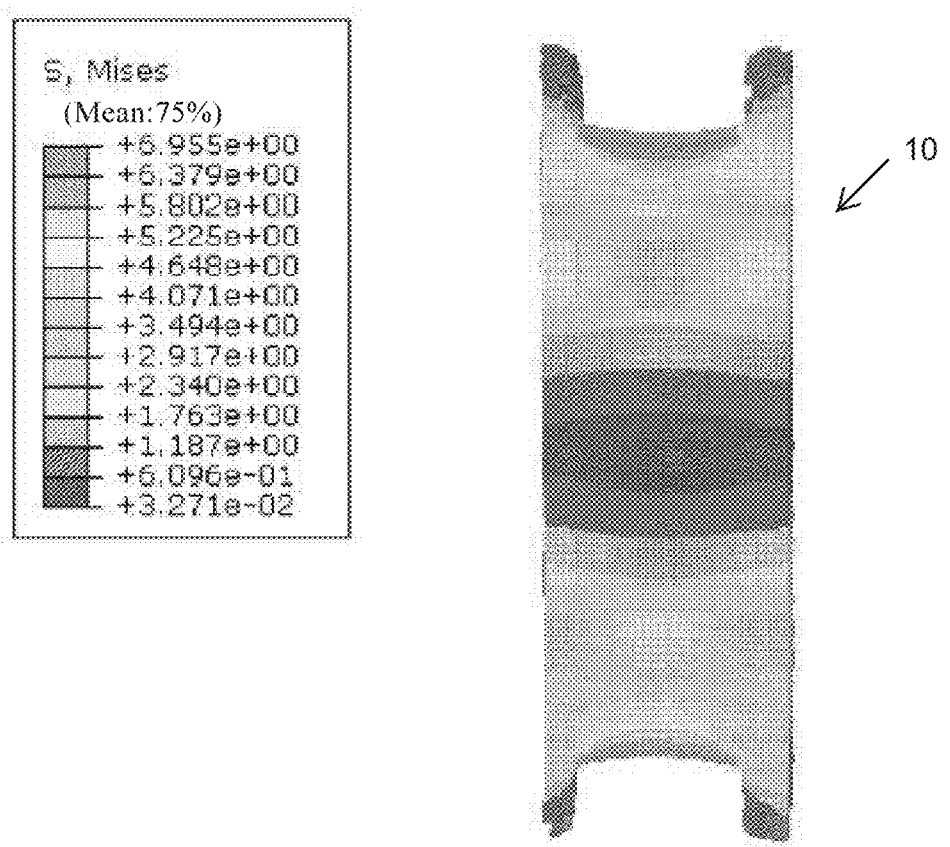
Figure 5D:
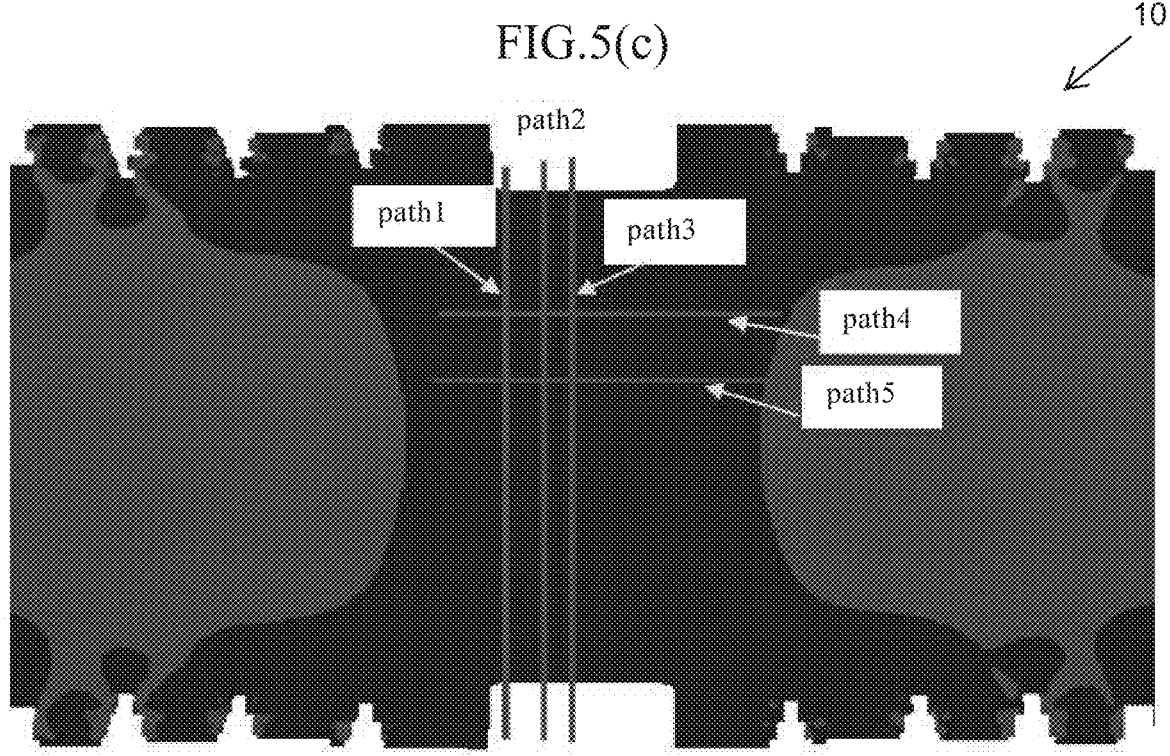

The material of the rotating axis 10 was subjected to high-temperature fatigue and creep tests to obtain S-N curves at stress ratios of R=−1 and R=0 at the assessment temperature, as shown in FIG. 2. At the same time, a creep rupture strength curve at the assessment temperature was obtained, as shown in FIG. 3.

Fatigue strengths for a life of $10^7$ cycles at stress ratios of R=−1 and R=0 were obtained according to the S-N curves obtained, and then the life was extrapolated using Equation (3) to obtain fatigue strength values for a designed life of $4\times10^{10}$ cycles, which were 96 MPa (R=−1) and 72 MPa (R=0), respectively. With scattering of the fatigue data and other factors taken into consideration, the resulting fatigue strength values were divided by a factor of 2 according to the method in ASME to obtain the designed fatigue strengths, which were 48 MPa (R=−1) and 36 MPa (R=0), respectively.

$$S_a^m N = C \quad (3)$$

In Equation (3), $S_a$ represented the stress amplitude; C and m were constants related with the material and the service conditions.

A creep rupture strength of 100 MPa was obtained for 613° C. and a life of $10^5$ hours from the creep rupture strength curve obtained by creep testing.

The fatigue portion of the dual-criterion diagram for designing and assessing the life and strength of the high-temperature rotating component was plotted using the designed values of the fatigue strength obtained in step (2). Namely, the fatigue data at stress ratios of R=−1 and R=0 for the designed life obtained in step (2) were plotted in a rectangular coordinate system with an abscissa axis representing the mean stress and an ordinate axis representing the stress amplitude, wherein the two points were connected to obtain a straight line, and the corresponding expression was shown by Equation (4).

$$\sigma_a = -\tfrac{1}{3}\sigma_m + 48 \quad (4)$$

In Equation (4), $\sigma_a$ was the stress amplitude, and $\sigma_m$ was the mean stress.

Figure 6:
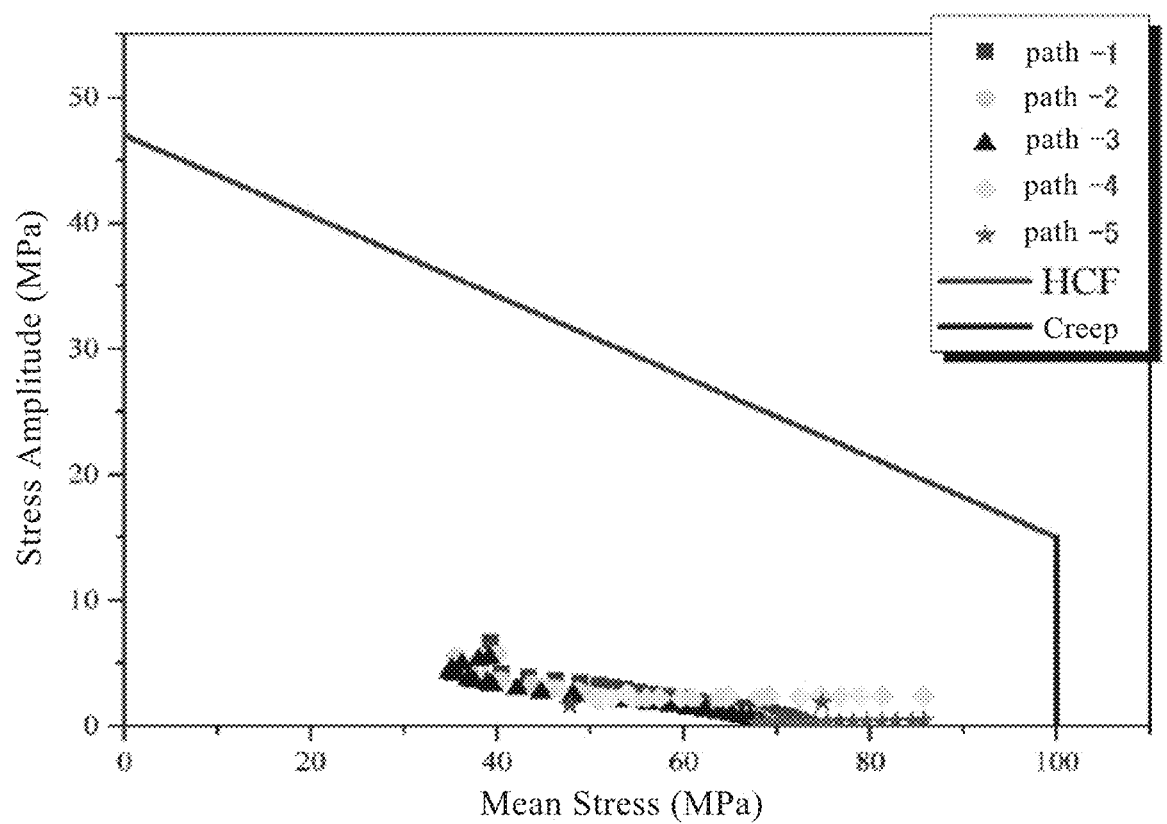
FIG. 6 is a diagram showing the assessment results in an embodiment according to the disclosure.

The creep portion of the dual-criterion diagram for designing and assessing the life and strength of the high-temperature rotating component was plotted using the creep rupture strength data of the high-temperature rotating component material obtained in step (3). This creep portion was a cutoff line of the straight line obtained in step (4), as shown by Equation (5). The dual-criterion diagram thus constructed was shown as a solid line in FIG. 6.

$$\sigma_m = 100\ MPa \quad (5)$$

The displacement boundary and thermal boundary of the rotating 10 axis were given by design. The resulting displacement boundary and thermal boundary were subjected to finite element analysis using software ABAQUS6.10 to obtain a temperature field and a stress field of the rotating axis 10. With reference to FIG. 5(*a*), the high-cycle fatigue strength of the rotating axis 10 in the 600-613° C. region was assessed based on the results of the analysis. FIG. 5(*b*) shows the mean stress at this location; FIG. 5(*c*) shows the stress amplitude. Several different paths were chosen for this location. The specific paths are shown in FIG. 5(*d*).

The mean stress and stress amplitude of the assessment region obtained in step (6) were plotted into the dual-criterion diagram for designing and assessing the life and strength of the high-temperature rotating component obtained in steps (3) and (4). The results shown in FIG. 6 demonstrate that all of the data fell in the safe region of the dual-criterion diagram for designing and assessing the life and strength of the high-temperature rotating component. Therefore, the high-cycle fatigue strength of this rotating axis 10 met the requirements in the designed life.

Comparative Example 1

Figure 7:
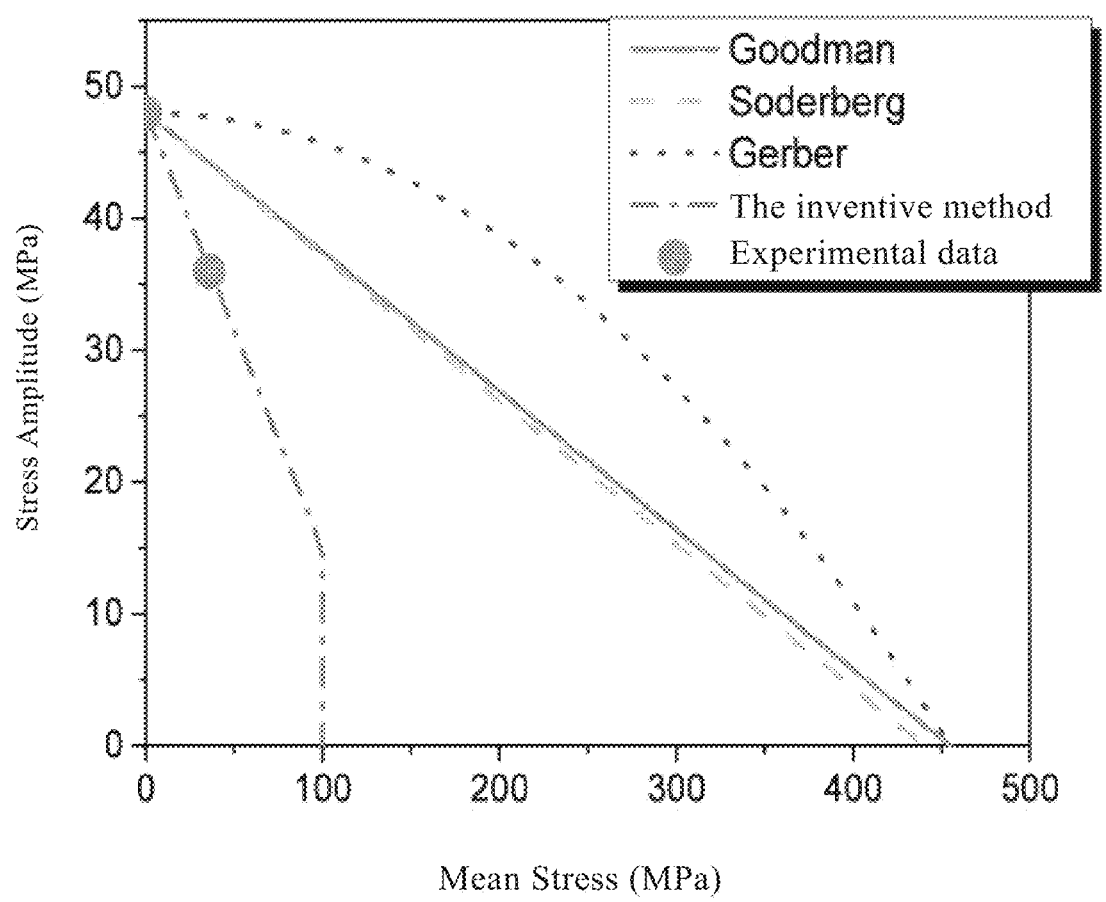
FIG. 7 is a comparative diagram showing assessments of an example using the current inventive method and other conventional methods.

Common methods such as Goodman Method, Soderberg Method, and Gerber Method were also used to design and assess the same material as in Example 1. The assessment results are shown in FIG. 7, which is a diagram comparing the results of the dual-criterion diagram method proposed by the disclosure with other conventional methods. As shown in FIG. 7, compared with the dual-criterion diagram method proposed by the disclosure, the results of the other methods obviously deviate from the experimental data points. Hence, the applicability of the other methods at high temperatures is limited apparently. Therefore, the applicability of the dual-criterion diagram proposed by the disclosure is obviously superior to other methods at high temperatures.

Additional Considerations

The Examples listed above are only preferred examples in the disclosure, and they are not intended to limit the scope of the disclosure. Equivalent variations and modifications according to the disclosure in the scope of the present application for invention all fall in the technical scope of the disclosure.

All of the documents mentioned in the disclosure are incorporated herein by reference, as if each of them were incorporated herein individually by reference. It is to be further understood that various changes or modifications to the invention can be made after reading the above contents of the invention, and these equivalent variations fall in the scope defined by the accompanying claims of the application as well.

One of ordinary skill will appreciate upon review of the present disclosure that all or some of the steps described herein may be performed on and/or with the assistance of one or more computing devices. An exemplary computing device for performing the steps of embodiments of the present invention may include a desktop computer, a laptop or tablet computer, a smartphone or similar device. The exemplary computing device may include a processing element, a memory element and a communication element.

The communication element generally allows communication with external systems or devices, such as one or more testing/sensor devices described or implied above, e.g., via wireless communication and/or data transmission over one or more direct or indirect radio links between devices. The communication element may include signal or data transmitting and receiving circuits, such as antennas, amplifiers, filters, mixers, oscillators, digital signal processors (DSPs), and the like. The communication element may establish communication wirelessly by utilizing RF signals and/or data that comply with communication standards such as cellular 2G, 3G, 4G, or 5G, WiFi, WiMAX, Bluetooth™, and the like, or combinations thereof. In addition, the communication element may utilize communication standards such as ANT, ANT+, Bluetooth™ low energy (BLE), the industrial, scientific, and medical (ISM) band at 2.4 gigahertz (GHz), or the like.

Alternatively, or in addition, the communication element may establish communication through connectors or couplers that receive metal conductor wires or cables which are compatible with networking technologies, such as ethernet. In certain embodiments, the communication element may also couple with optical fiber cables. The communication element may be in communication with the processing element and the memory element of the computing device, again such as wireless communication and data transmission over one or more radio links.

The memory element of the computing device may include electronic hardware data storage components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element may be embedded in, or packaged in the same package as, the processing element. The memory element may include, or may constitute, a "computer-readable medium." The memory element may store the instructions, code, code segments, software, firmware, programs, applications, apps, modules, agents, services, daemons, or the like that are executed by the processing element, including engineering design application(s), testing device driver (s), and other programs described or implied herein. The memory element may also store settings, data, documents, sound files, photographs, movies, images, databases, and the like, including the items described throughout this disclosure.

The processing element of the computing device may include electronic hardware components such as processors. The processing element may include microprocessors (single-core and multi-core), microcontrollers, digital signal processors (DSPs), field-programmable gate arrays (FPGAs), analog and/or digital application-specific integrated circuits (ASICs), or the like, or combinations thereof. The processing element may generally execute, process, or run instructions, code, code segments, software, firmware, programs, applications, apps, modules, agents, processes, services, daemons, or the like, including engineering design application(s), testing device driver(s) or the like described and/or implied throughout this disclosure. The processing element may also include hardware components such as finite-state machines, sequential and combinational logic, and other electronic circuits that can perform the functions necessary for the operation of the current invention. The processing element may be in communication with the other electronic components through serial or parallel links that include address busses, data busses, control lines, and the like.

Through hardware, software, firmware, or combinations thereof, the processing element of the computing device may be configured or programmed to perform the functions described herein. For example, the processing element may execute a data acquisition module and/or testing device driver(s) to execute and/or receive data from materials testing sequences described herein (e.g., as conducted by the electromagnetic resonance and/or lever-type testing apparatuses outlined above). For another example, the processing element may facilitate test data and/or analyses exchanges between the test device(s), the data acquisition module and/or the engineering design application(s). For still another example, the processing element may execute the engineering design application(s) to permit a user—for example, via a user interface including a display—to initiate, perform and/or view progress and/or results of automated computation(s) and/or plotting for generating dual-criterion diagram(s) for designing and assessing the life and strength of a high-temperature rotating component comprising a material as outlined herein. For yet still another example, stress analyses (e.g., utilizing finite element analysis and a structural model) may be conducted using commercial software such as those programs made available under one or more of the following trademarks as of the filing date of the present disclosure: ABAQUS® (a registered trademark of Dassault Systemes Simulia Corp.); and ANSYS® (a registered trademark of Ansys, Inc.).

What is claimed is:

1. A method for establishing a dual-criterion diagram for designing and assessing the life and strength of a high-temperature rotating component comprising a material, the method comprising the following steps:

$S_1$, conducting high-temperature fatigue and creep tests using the high-temperature rotating component material, wherein the high-temperature fatigue test is conducted using an electromagnetic resonance high-frequency testing machine including a heating device and operated in a stress control mode within a frequency range of 50-250 Hz (inclusive) and the high-temperature creep test is conducted using a lever type mechanical creep testing machine including a heating device and operated in a stress control mode;

$S_2$, obtaining fatigue strengths of the material for a given life from fatigue data generated by the high-temperature fatigue test at stress ratios of R=−1 and R=0, wherein a data scattering factor is taken into account by giving a safety factor when the fatigue data are converted into design data;

$S_3$, obtaining creep rupture strength data of the high-temperature rotating component material for a given life from results of the creep test;

$S_4$, plotting a fatigue portion of the dual-criterion diagram for designing and assessing the life and strength of the high-temperature rotating components from the fatigue data of the high-temperature rotating component material obtained in step $S_2$, so as to obtain a straight line with an abscissa axis representing mean stress and an ordinate axis representing stress amplitude; and $S_5$, plotting a creep portion of the dual-criterion diagram for designing and assessing the life and strength of the high-temperature rotating component from the creep rupture strength data of the high-temperature rotating component material obtained in step $S_3$, wherein the creep portion is a cutoff line of the straight line in step $S_4$, and a straight line perpendicular to the abscissa axis representing mean stress.

2. The method of claim 1, wherein in step $S_2$, in the case that an S-N curve of the material is known, the fatigue strength of the material for a given life is obtained by interpolating or extrapolating the S-N curve.

3. The method of claim 1, wherein step $S_4$ comprises plotting the fatigue data corresponding to a designed life at stress ratios of R=−1 and R=0 obtained in step $S_2$, with the abscissa axis representing mean stress and the ordinate axis representing stress amplitude, and wherein the fatigue portion in step $S_4$ is represented by the following Equation (1):

$$\sigma_a = \frac{\sigma_0 - \sigma_{-1}}{\sigma_0}\sigma_m + \sigma_{-1}$$

where $\sigma_m$, is mean stress; $\sigma_a$ is stress amplitude; $\sigma_{-1}$ represents a fatigue strength at R=−1 for a designed life; and $\sigma_0$ represents a fatigue strength at R=0 for the designed life.

4. The method of claim 1, wherein the creep portion in step $S_5$ is represented by the following Equation (2):

$$\sigma_m = \sigma(t, T) \qquad (2)$$

where $\sigma_m$ is mean stress; $\sigma(t, T)$ is a creep rupture strength at a service temperature for a designed life; t represents the service time; T represents the service temperature; wherein Equation (2) indicates that mean stress at this time is equivalent to the creep rupture strength for the designed life.

5. A method for designing and assessing the life and strength of the high-temperature rotating component using the dual-criterion diagram established according to the method of claim 1 comprising:

$S_6$, conducting stress analysis of the high-temperature rotating component utilizing finite element analysis and a structural model, based on material performance parameters and service parameters of the high-temperature rotating component to obtain mean stress and stress amplitude of the high-temperature rotating component at alternating loads, and to determine a critical section and critical point of the high-temperature rotating component under service conditions;

$S_7$, plotting mean stress and stress amplitude of the high-temperature rotating component at the critical section and the critical point into the dual-criterion diagram, wherein the high-temperature rotating component is safe in a designed life if a point having a horizontal coordinate representing mean stress and a vertical coordinate representing stress amplitude falls in a safe region defined under a curve formed from the fatigue portion and the creep portion of the dual-criterion diagram.

6. The method of claim 5, wherein in step $S_6$, determining the critical section and the critical point of the high-temperature rotating component under service conditions includes determining a high mean stress region and a high stress amplitude region of the high-temperature rotating component.

7. The method of claim 5, wherein in step $S_6$, the material performance parameters of the rotating component material include linear expansion coefficient $\alpha$, elastic modulus E, Poisson ratio $\mu$ and material density $\rho$, and the service parameters of the high-temperature rotating component include rotating speed, thermal boundary and displacement boundary.

8. The method of claim 5, wherein in step $S_6$, the material performance parameters and the service parameters of the rotating component material are obtained by at least one of: (A) searching a database of material performances; and (B) conducting corresponding tests.

9. The method of claim 5, wherein in step $S_7$, if a point having a horizontal coordinate representing mean stress and a vertical coordinate representing stress amplitude does not fall in the safe region, a design scheme is modified by returning to step $S_6$ and repeating the analysis.

* * * * *

UNITED STATES PATENT AND TRADEMARK OFFICE
CERTIFICATE OF CORRECTION

| | |
|---|---|
| PATENT NO. | : 11,274,988 B2 |
| APPLICATION NO. | : 16/236399 |
| DATED | : March 15, 2022 |
| INVENTOR(S) | : Fuzhen Xuan et al. |

It is certified that error appears in the above-identified patent and that said Letters Patent is hereby corrected as shown below:

On the Title Page

Item (12) should read Xuan et al.

Please replace the current text in Item (72) Inventor with the following text:
--Fuzhen Xuan, Shanghai (CN);
Weichang Zhang, Shanghai (CN);
Mingliang Zhu, Shanghai (CN);
Jianguo Gong, Shanghai (CN); and
Shantung Tu, Shanghai (CN)--

Signed and Sealed this
Second Day of May, 2023

Katherine Kelly Vidal
*Director of the United States Patent and Trademark Office*